(12) United States Patent
Boyaci et al.

(10) Patent No.: US 12,032,024 B2
(45) Date of Patent: Jul. 9, 2024

(54) MONITORING SYSTEM FOR A LOW VOLTAGE, MEDIUM VOLTAGE, OR HIGH VOLTAGE CIRCUIT BREAKER

(71) Applicant: ABB Schweiz AG, Baden (CH)

(72) Inventors: Aydin Boyaci, Karlsruhe (DE); Ido Amihai, Heppenheim (DE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/875,715

(22) Filed: Jul. 28, 2022

(65) Prior Publication Data

US 2023/0033088 A1 Feb. 2, 2023

(30) Foreign Application Priority Data

Jul. 30, 2021 (EP) ..................................... 21188891

(51) Int. Cl.
*G01R 31/327* (2006.01)

(52) U.S. Cl.
CPC .................................. *G01R 31/327* (2013.01)

(58) Field of Classification Search
CPC ............. G01R 31/327; G01R 31/3271; G01R 31/3272; G01R 31/3274; G01R 31/3275;
(Continued)

(56) References Cited

U.S. PATENT DOCUMENTS 6,215,408 B1 * 4/2001 Leonard ............. G01R 31/3274
324/415
6,967,483 B2 * 11/2005 Kwark ................. G01R 31/327
324/421
(Continued)

FOREIGN PATENT DOCUMENTS

CN 106017879 A * 10/2016 ............ G01M 13/00
CN 115184787 A * 10/2022
(Continued)

OTHER PUBLICATIONS

Moeanaddin et al., A comparison of likelihood ratio test and CUSUM test for threshold autoregression. The Statistician. pp. 213-225. 1998 (Year: 1998).*
(Continued)

*Primary Examiner* — Lee E Rodak
*Assistant Examiner* — Demetrius R Pretlow
(74) *Attorney, Agent, or Firm* — Leydig, Voit & Mayer, Ltd.

(57) ABSTRACT

A system and method for monitoring a circuit breaker monitoring system includes a vibration sensor, a processing unit, and an output unit. The vibration sensor is mounted to a circuit breaker acquires a temporal vibration signal over at least a temporal portion of a closing operation of the circuit breaker, wherein the closing operation comprises: initiation of the closing operation, latch release, movement of a moveable contact towards a fixed contact, contact touch of the moveable contact with the fixed contact, and stop of movement of the moveable contact. The vibration sensor provides the temporal vibration signal to the processing unit, which determines a plurality of features of the closing operation and an indication of operational functionality of the circuit breaker.

14 Claims, 6 Drawing Sheets

(58) Field of Classification Search
CPC .............. G01R 31/3277; G01R 31/333; G01R 31/3333; G01R 31/3278; H01H 1/14; H01H 3/32; H01H 9/02; H01H 11/0062; G01D 5/20; G01D 5/2073
USPC .................................................. 324/420–424
See application file for complete search history.

(56) References Cited

U.S. PATENT DOCUMENTS

| | | | | |
|---|---|---|---|---|
| 8,964,344 | B2* | 2/2015 | Spangenberg | H01H 33/26 361/8 |
| 9,704,661 | B2* | 7/2017 | Chen | H01H 3/26 |
| 9,772,380 | B2* | 9/2017 | Ware | H01H 71/04 |
| 10,012,697 | B2* | 7/2018 | Yang | H01H 33/666 |
| 10,345,141 | B2* | 7/2019 | Ledbetter | G01H 1/00 |
| 10,533,978 | B2* | 1/2020 | Benke | G01N 29/46 |
| 10,539,618 | B2* | 1/2020 | Yang | G01R 31/3274 |
| 10,903,023 | B2* | 1/2021 | Roby | G01S 17/66 |
| 11,239,033 | B2* | 2/2022 | Marinkovic | H01H 11/0062 |
| 2005/0237064 | A1* | 10/2005 | Kwark | G01R 31/327 324/421 |
| 2012/0306656 | A1* | 12/2012 | Boucher | H01H 33/563 324/424 |
| 2014/0055886 | A1* | 2/2014 | Spangenberg | H02H 1/0023 361/2 |
| 2014/0069195 | A1* | 3/2014 | Ledbetter | G01H 1/00 73/649 |
| 2016/0327611 | A1* | 11/2016 | Ware | H01H 73/12 |
| 2017/0045481 | A1* | 2/2017 | Benke | G01N 29/46 |
| 2017/0047174 | A1* | 2/2017 | Chen | H01H 3/38 |
| 2017/0047181 | A1* | 2/2017 | Yang | H01H 3/3005 |
| 2018/0059186 | A1* | 3/2018 | Yang | H02H 1/0092 |
| 2019/0252135 | A1* | 8/2019 | Roby | G08C 23/04 |
| 2020/0203088 | A1* | 6/2020 | Marinkovic | H01H 3/30 |
| 2021/0018542 | A1* | 1/2021 | Bates | G01R 23/20 |
| 2022/0165526 | A1* | 5/2022 | Amihai | H01H 47/002 |
| 2023/0033088 | A1* | 2/2023 | Boyaci | G01R 31/3274 |
| 2023/0035276 | A1* | 2/2023 | Boyaci | G01R 31/3274 |

FOREIGN PATENT DOCUMENTS

| | | | | |
|---|---|---|---|---|
| CN | 115308589 | A | * | 11/2022 |
| CN | 115597704 | A | * | 1/2023 |
| DE | 102010005525 | A1 | | 7/2011 |
| DE | 102018210470 | A1 | | 1/2020 |
| EP | 3091553 | A1 | * | 11/2016 ............. G01P 15/00 |
| EP | 4124873 | A1 | * | 2/2023 ............ G01R 31/327 |
| EP | 4124874 | A1 | * | 2/2023 ............ G01R 31/327 |
| JP | 2002535664 | A | * | 10/2022 |
| KR | 20230059124 | A | * | 5/2023 |
| RU | 2672769 | C2 | * | 11/2018 ............ G01R 31/327 |
| WO | WO-2019158754 | A9 | * | 12/2019 ............. G01R 23/16 |

OTHER PUBLICATIONS

Flynn et al., Change Detection with the Kernal Cumulative Sum Algorithm. Submitted to the 58th IEEE Conference on Decision and Control Control Conference to be held at Nice France Dec. 11-13, 2019 (Year: 2019).*

European Patent Office, Extended European Search Report in European Patent Application No. 21188891.2, 9 pp. (Jan. 25, 2022).

* cited by examiner

MONITORING SYSTEM FOR A LOW VOLTAGE, MEDIUM VOLTAGE, OR HIGH VOLTAGE CIRCUIT BREAKER

CROSS-REFERENCE TO RELATED APPLICATIONS

This patent application claims priority to European Patent Application No. 21188891.2, filed on Jul. 30, 2021, which is incorporated herein in its entirety by reference.

FIELD OF THE DISCLOSURE

The present disclosure relates to monitoring systems for a low voltage, medium voltage or high voltage circuit breaker, monitoring methods for a low voltage, medium voltage or high voltage circuit breaker and to a circuit breaker having one or more of such monitoring systems.

BACKGROUND OF THE INVENTION

Vibration analysis is a common approach for the monitoring of the operating mechanism and drives of circuit breaker (CBs).

Vibration monitoring is however mainly applied to detect mechanical faults/failures and not to extract timing information from the detection of switching events.

Today, very expensive sensors, such as potentiometers or encoders, are used to evaluate the travel curve that give additional information about the current health status of the CB.

Such sensors result in higher costs, making permanent installation unattractive.

BRIEF SUMMARY OF THE INVENTION

Therefore, it would be advantageous to have an improved technique to monitor a low voltage, medium voltage, or high voltage circuit breaker.

In a first aspect, there is provided a circuit breaker monitoring system, comprising: a vibration sensor; a processing unit; and an output unit.

The vibration sensor is configured to be mounted to a circuit breaker. The vibration sensor is configured to acquire a temporal vibration signal over at least a temporal portion of a closing operation of the circuit breaker. The closing operation comprises: initiation of the closing operation, latch release, movement of a moveable contact towards a fixed contact, contact touch of the moveable contact with the fixed contact, and stop of movement of the moveable contact. The vibration sensor is configured to provide the temporal vibration signal to the processing unit. The processing unit is configured to determine a plurality of features of the closing operation, where each feature is associated with one of: the initiation of the closing operation, the latch release, the movement of the moveable contact towards the fixed contact, the contact touch of the moveable contact with the fixed contact, and the stop of movement of the moveable contact. The determination of the plurality of features of the closing operation comprises analysis of the temporal vibration signal to identify a plurality of changes in the temporal vibration signal that are assigned to the plurality of features of the closing operation. The processing unit is configured to determine an indication of operational functionality of the circuit breaker. This determination comprises utilization of the plurality of features of the closing operation. The output unit is configured to output information relating to the indication of operational functionality of the circuit breaker.

BRIEF DESCRIPTION OF THE SEVERAL VIEWS OF THE DRAWING(S)

Exemplary embodiments will be described in the following with reference to the following drawings.

Figure 6:
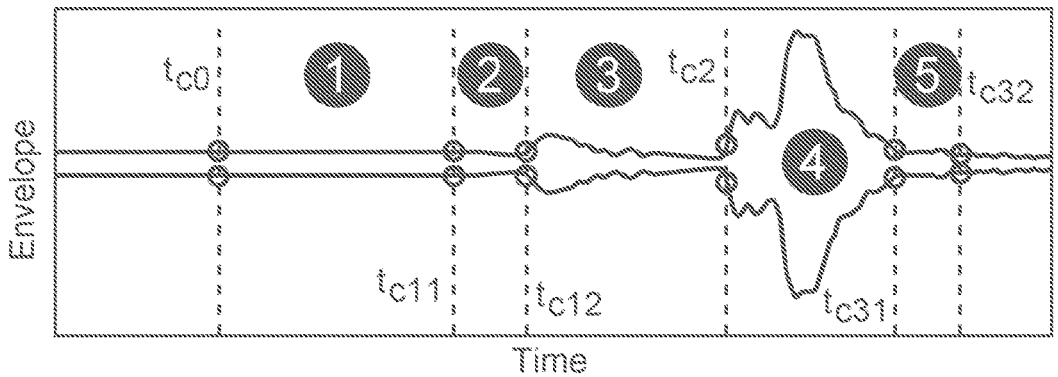

FIG. 6 shows an envelope curve of a vibration signal measured at a fixed part for a typical closing operation of a medium-voltage circuit breaker: Relevant time instants can be extracted as changepoints from the envelope curve. Also shown is definition of different regions 1-5 according to status of the breaker operation, where every region is considered individually to extract features for identifying failure location & mode.

Figure 7:
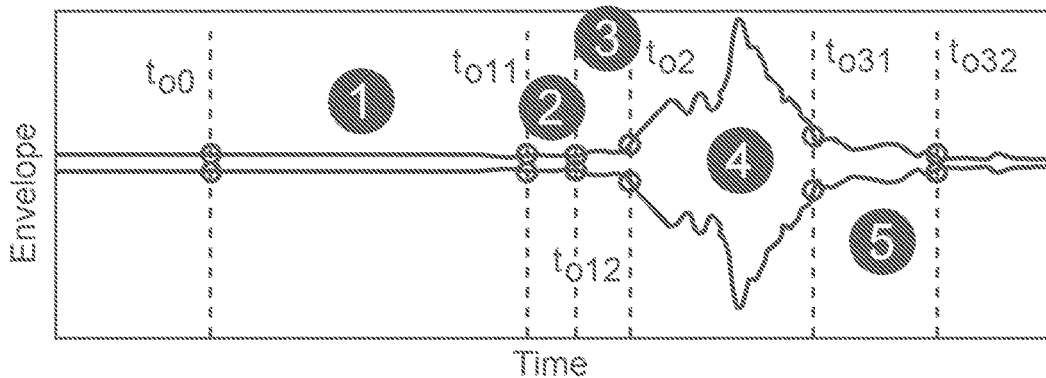

FIG. 7 shows an envelope curve of a vibration signal measured at a fixed part for a typical opening operation of a medium-voltage circuit breaker: Relevant time instants can be extracted as changepoints from the envelope curve. Also shown is definition of different regions 1-5 according to status of breaker operation, where every region is considered individually to extract features for identifying failure location & mode.

Figure 8:
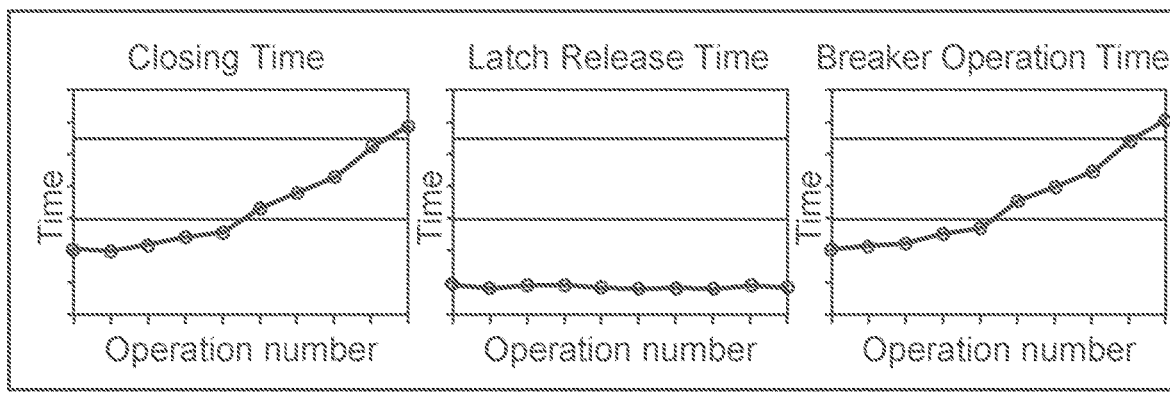

FIG. 8 shows exemplary features (switching times) with predefined thresholds for closing operation leading to the statuses (bottom section/mid section/top section) of the three features considered here for the circuit breaker: a) Closing time $t_{c2}$–$t_{c0}$ (capturing region 1, 2 & 3). b) Latch release time $t_{c12}$–$t_{c0}$ (capturing region 1 & 2). c) Breaker operation time $t_{o2}$–$t_{c12}$ (capturing region 3).

Figure 9:
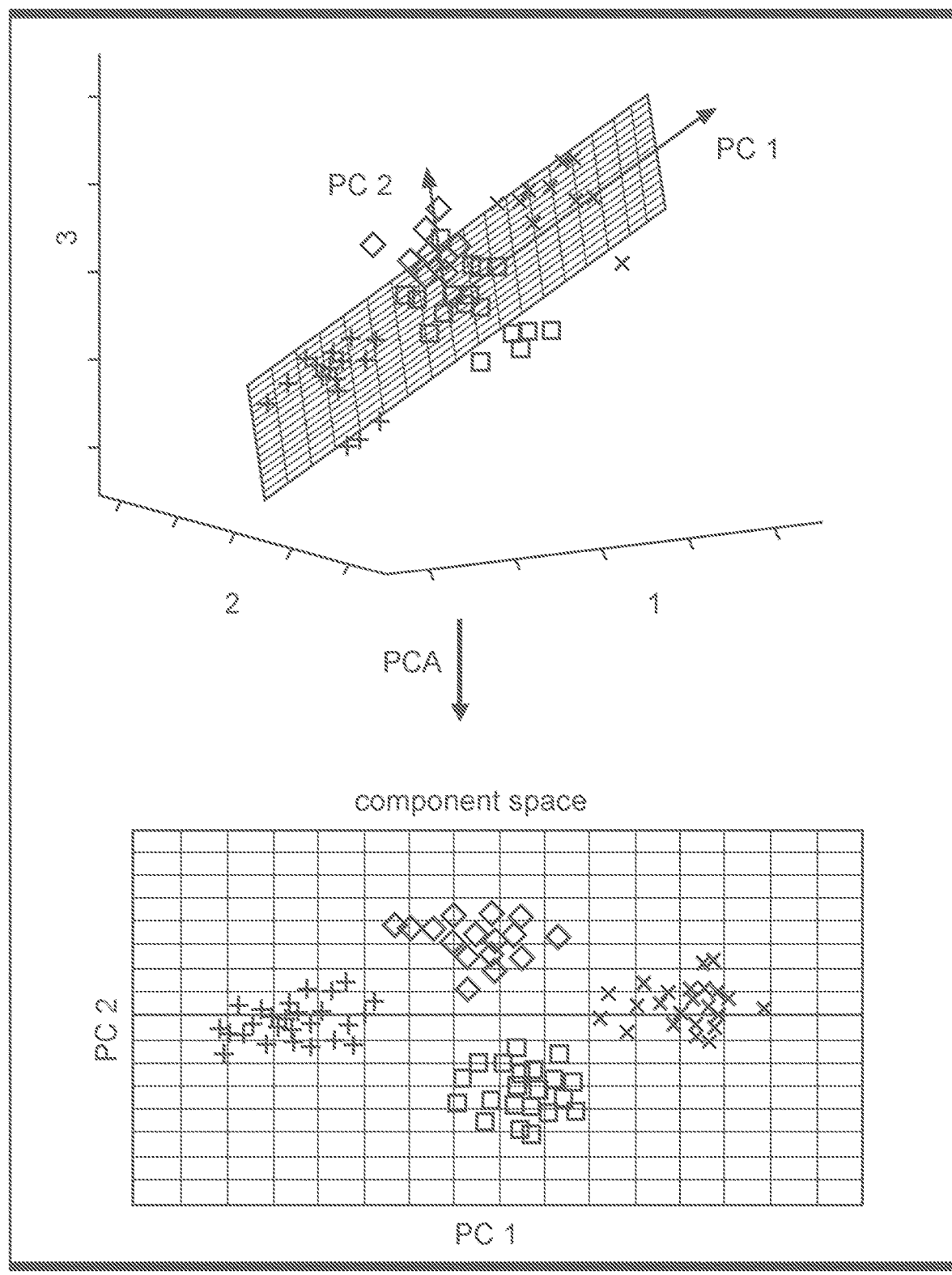

FIG. 9 shows reduction of the dimensionality of the data by using PCA—Principal Component Analysis.

Figure 10:
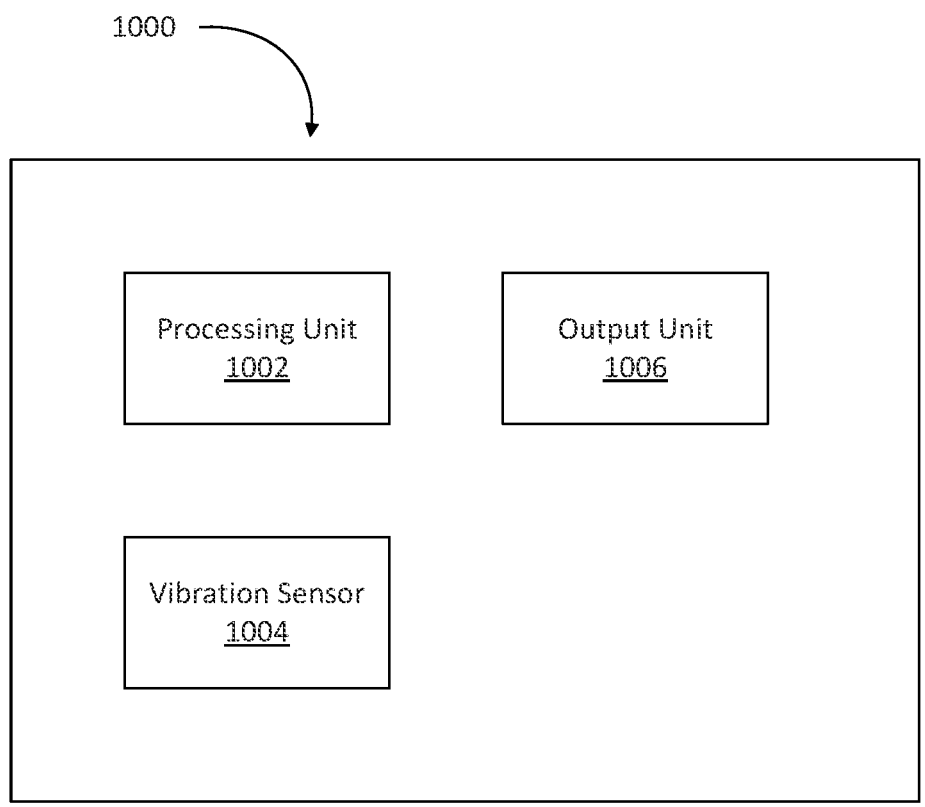

FIG. 10 shows a circuit breaker monitoring system comprising a vibration sensor, a processing unit, and an output unit.

DETAILED DESCRIPTION OF THE INVENTION

FIGS. 1-9 relate to monitoring systems and methods for a low voltage, medium voltage or high voltage circuit breaker.

In an example, a circuit breaker monitoring system (e.g., circuit breaker monitoring system 1000 of FIG. 10) comprises a vibration sensor (e.g., vibration sensor 1004 of FIG. 10), a processing unit (e.g., processing unit 1002 of FIG. 10), and an output unit (e.g., output unit 1006 of FIG. 10). The vibration sensor is configured to be mounted to a circuit breaker. The vibration sensor is configured to acquire a temporal vibration signal over at least a temporal portion of a closing operation of the circuit breaker. The closing operation comprises: initiation of the closing operation, latch release, movement of a moveable contact towards a fixed contact, contact touch of the moveable contact with the fixed contact, and stop of movement of the moveable contact. The vibration sensor is configured to provide the temporal vibration signal to the processing unit. The processing unit is configured to determine a plurality of features of the closing operation, where each feature is associated with one of: the initiation of the closing operation, the latch release, the movement of the moveable contact towards the fixed contact, the contact touch of the moveable contact with the fixed contact, and the stop of movement of the moveable contact. The determination of the plurality of features of the closing operation comprises analysis of the temporal vibration signal to identify a plurality of changes in the temporal vibration signal that are assigned to the plurality of features of the closing operation. The processing unit is configured to determine an indication of operational functionality of the circuit breaker, wherein the determination comprises utilization of the plurality of features of the closing operation. The output unit is configured to output information relating to the indication of operational functionality of the circuit breaker.

In an example, the vibration sensor is an accelerometer, acoustic "SAW" sensor, or RFID sensor.

According to an example, analysis of the temporal vibration signal to identify a plurality of changes in the temporal vibration signal comprises computation of a temporal signal envelope from the temporal vibration signal. The identification of the plurality of changes in the temporal vibration signal can then comprise identification of a plurality of changes in the temporal signal envelope that are assigned to the plurality of features of the closing operation.

According to an example, the processing unit is configured to implement a peak transform, an RMS transform, or a Hilbert transform to compute the temporal signal envelope from the temporal vibration signal. These are specific examples of how the temporal signal envelope can be computed, however there are further mathematical methods, discussed for example in available literature, to compute the temporal signal envelope that could be utilized.

According to an example, analysis of the temporal vibration signal to identify a plurality of changes in the temporal vibration signal that are assigned to the plurality of features of the closing operation comprises utilization of one of: descriptive statistics; Transforms; machine learning or artificial intelligence; characteristic times associated with the closing operation of the circuit breaker.

According to an example, descriptive statistics is one of: mean, RMS, or Kurtosis analysis; and wherein Transforms is one of: FFT, Wavelets, empirical mode decomposition, Hilbert-Huang-Transform. These are specific examples of how the changes in the temporal vibration signal that are assigned to the plurality of features can be identified, however there are further mathematical methods, discussed for example in available literature, to identify the changes in the temporal vibration signal that are assigned to the plurality of features that could be utilized.

According to an example, the processing unit is configured to determine a plurality of physical switch events and corresponding plurality of time points of the plurality of physical switch events over the closing operation of the circuit breaker comprising analysis of the temporal vibration signal to identify a plurality of changes in the temporal vibration signal that are assigned to the plurality of physical switch events. The processing unit is configured to determine the one or more characteristic times associated with the closing operation of the circuit breaker comprising utilization of the plurality of physical switch events and corresponding plurality of time points.

According to an example, the processing unit is configured to implement a change point detection algorithm, a piecewise linear approximation algorithm, a cluster based method, or a state space representation to identify the plurality of change points in the temporal signal envelope that are assigned to the plurality of physical switch events.

According to an example, the cluster based method is a Gaussian Mixture Model "GMM", or a Hidden Markov Model "HMM"; and wherein the state space representation is a Kalman Filter or Likelihood Ratio Method.

In an example, the likelihood ratio method is RuLSIF or CUSUM.

According to an example, the physical switch events comprises two or more of: instant of latch release; instant of onset of movement of the moveable contact towards the fixed contact; instant of contact touch of the moveable contact with the fixed contact; instant of stop of movement of the moveable contact.

According to an example, computation of the temporal signal envelope from the temporal vibration signal comprises a low pass filtering and/or a high pass filtering before and/or after computation of the temporal signal envelope.

According to an example, determination of the indication of operational functionality of the circuit breaker comprises a comparison of the plurality of features of the closing operation with corresponding baseline features for one or more calibration circuit breakers.

In other words, a comparison of the current features at a certain operation number is made with a set of features for which it is known that they represent a healthy state. This could also involve a comparison of the current features with features for the "new" breaker (e.g. end-of-line measurements), and could involve with features calculated at low operation numbers.

The above monitoring system can also be used to monitor the opening operation of the circuit breaker or a different monitoring system can be used. Such a circuit breaker monitoring system comprises a vibration sensor, a processing unit, and an output unit. The vibration sensor is configured to be mounted to a circuit breaker. The vibration sensor is configured to acquire a temporal vibration signal over at least a temporal portion of an opening operation of the circuit breaker, wherein the opening operation comprises: initiation of the opening operation, latch release, movement of a moveable contact away from a fixed contact, separation of the moveable contact from the fixed contact, stop of movement of the moveable contact. The vibration sensor is configured to provide the temporal vibration signal to the processing unit. The processing unit is configured to determine a plurality of features of the opening operation, where each feature is associated with one of: the initiation of the opening operation, the latch release, the movement of the moveable contact away from the fixed contact, the separation of the moveable contact from the fixed contact, the stop of movement of the moveable contact. The determination of the plurality of features of the opening operation comprises analysis of the temporal vibration signal to identify a plurality of changes in the temporal vibration signal that are assigned to the plurality of features of the opening operation. The processing unit is configured to determine an indication of operational functionality of the circuit breaker comprising utilization of the plurality of features of the opening operation. The output unit is configured to output information relating to the indication of operational functionality of the circuit breaker.

In an example, the vibration sensor is an accelerometer, acoustic "SAW" sensor, or RFD sensor.

In an example, analysis of the temporal vibration signal to identify a plurality of changes in the temporal vibration signal comprises computation of a temporal signal envelope from the temporal vibration signal. The identification of the plurality of changes in the temporal vibration signal can then comprise identification of a plurality of changes in the temporal signal envelope that are assigned to the plurality of features of the closing operation. In an example, the processing unit is configured to implement a peak transform, an RMS transform, or a Hilbert transform to compute the temporal signal envelope from the temporal vibration signal.

In an example, analysis of the temporal vibration signal to identify a plurality of changes in the temporal vibration signal that are assigned to the plurality of features of the opening operation comprises utilization of one of: descriptive statistics; Transforms; machine learning or artificial intelligence; characteristic times associated with the closing operation of the circuit breaker.

In an example, descriptive statistics is one of: mean, RMS, or Kurtosis analysis; and wherein Transforms is one of: FFT, Wavelets, empirical mode decomposition, Hilbert-Huang-Transform.

In an example, the processing unit is configured to determine a plurality of physical switch events and corresponding plurality of time points of the plurality of physical switch events over the opening operation of the circuit breaker comprising analysis of the temporal vibration signal to identify a plurality of changes in the temporal vibration signal that are assigned to the plurality of physical switch events. The processing unit is configured to determine the one or more characteristic times associated with the opening operation of the circuit breaker comprising utilization of the plurality of physical switch events and corresponding plurality of time points.

In an example, the processing unit is configured to implement a change point detection algorithm, a piecewise linear approximation algorithm, a cluster based method, or a state space representation to identify the plurality of change points in the temporal signal envelope that are assigned to the plurality of physical switch events.

In an example, the cluster based method is a Gaussian Mixture Model "GMM", or a Hidden Markov Model "HMM"; and wherein the state space representation is a Kalman Filter or Likelihood Ratio Method.

In an example, the likelihood ratio method is RuLSIF or CUSUM.

In an example, the physical switch events comprises two or more of: instant of latch release; instant of onset of movement of the moveable contact away from the fixed contact; instant of separation of the moveable contact from the fixed contact; instant of stop of movement of the moveable contact.

In an example, computation of the temporal signal envelope from the temporal vibration signal comprises a low pass filtering and/or a high pass filtering before and/or after computation of the temporal signal envelope.

In an example, determination of the indication of operational functionality of the circuit breaker comprises a comparison of the plurality of features of the opening operation with corresponding baseline features for one or more calibration circuit breakers.

In an example, a circuit breaker monitoring method comprises: mounting a vibration sensor to a circuit breaker; acquiring by the vibration sensor a temporal vibration signal over at least a temporal portion of a closing operation of the circuit breaker, wherein the closing operation comprises: initiation of the closing operation, latch release, movement of a moveable contact towards a fixed contact, contact touch of the moveable contact with the fixed contact, and stop of movement of the moveable contact; providing the temporal vibration signal to a processing unit; determining by the processing unit a plurality of features of the closing operation, wherein each feature is associated with one of: the initiation of the closing operation, the latch release, the movement of the moveable contact towards the fixed contact, the contact touch of the moveable contact with the fixed contact, and the stop of movement of the moveable contact, wherein the determining comprises analysis of the temporal vibration signal to identify a plurality of changes in the temporal vibration signal that are assigned to the plurality of features of the closing operation; determining by the processing unit an indication of operational functionality of the circuit breaker, wherein the determining comprises utilization of the plurality of features of the closing operation; and outputting by an output unit information relating to the indication of operational functionality of the circuit breaker.

In an example, the vibration sensor is an accelerometer, acoustic "SAW" sensor, or RFID sensor.

In an example, analysing the temporal vibration signal to identify a plurality of changes in the temporal vibration signal comprises computing a temporal signal envelope from the temporal vibration signal. The identifying the plurality of changes in the temporal vibration signal can then comprise identifying a plurality of changes in the temporal signal envelope that are assigned to the plurality of features of the closing operation.

In an example, method comprises implementing by the processing unit a peak transform, an RMS transform, or a Hilbert transform to compute the temporal signal envelope from the temporal vibration signal.

In an example, analysis of the temporal vibration signal to identify a plurality of changes in the temporal vibration signal that are assigned to the plurality of features of the closing operation comprises utilizing one of: descriptive statistics; Transforms; machine learning or artificial intelligence; characteristic times associated with the closing operation of the circuit breaker.

In an example, descriptive statistics is one of: mean, RMS, or Kurtosis analysis; and Transforms is one of: FFT, Wavelets, empirical mode decomposition, Hilbert-Huang-Transform.

In an example, method comprises determining by the processing unit a plurality of physical switch events and corresponding plurality of time points of the plurality of physical switch events over the closing operation of the circuit breaker, wherein the determining comprises analysing the temporal vibration signal to identify a plurality of changes in the temporal vibration signal that are assigned to the plurality of physical switch events, and wherein the determining the one or more characteristic times associated with the closing operation of the circuit breaker comprises utilizing the plurality of physical switch events and corresponding plurality of time points.

In an example, the method comprises implementing by the processing unit a change point detection algorithm, a piecewise linear approximation algorithm, a cluster based method, or a state space representation to identify the plurality of change points in the temporal signal envelope that are assigned to the plurality of physical switch events.

In an example, the cluster based method is a Gaussian Mixture Model "GMM", or a Hidden Markov Model "HMM"; and wherein the state space representation is a Kalman Filter or Likelihood Ratio Method.

In an example, the likelihood ratio method is RuLSIF or CUSUM.

In an example, the physical switch events comprises two or more of: instant of latch release; instant of onset of movement of the moveable contact towards the fixed contact; instant of contact touch of the moveable contact with the fixed contact; instant of stop of movement of the moveable contact.

In an example, computing the temporal signal envelope from the temporal vibration signal comprises a low pass filtering and/or a high pass filtering before and/or after computation of the temporal signal envelope.

In an example, determining the indication of operational functionality of the circuit breaker comprises comparing the plurality of features of the closing operation with corresponding baseline features for one or more calibration circuit breakers.

In an example, a circuit breaker monitoring method comprises: mounting a vibration sensor to a circuit breaker; acquiring by the vibration sensor a temporal vibration signal over at least a temporal portion of an opening operation of the circuit breaker, wherein the opening operation comprises: initiation of the opening operation, latch release, movement of a moveable contact away from a fixed contact, separation of the moveable contact from the fixed contact, stop of movement of the moveable contact; providing the temporal vibration signal to a processing unit; determining by the processing unit a plurality of features of the opening operation, wherein each feature is associated with one of: the initiation of the opening operation, the latch release, the movement of the moveable contact away from the fixed contact, the separation of the moveable contact from the fixed contact, the stop of movement of the moveable contact, wherein the determination comprises analysis of the temporal vibration signal to identify a plurality of changes in the temporal vibration signal that are assigned to the plurality of features of the opening operation; determining by the processing unit an indication of operational functionality of the circuit breaker, wherein the determination comprises utilizing the plurality of features of the opening operation; and outputting by an output unit information relating to the indication of operational functionality of the circuit breaker.

In an example, the vibration sensor is an accelerometer, acoustic "SAW" sensor, or RFID sensor.

In an example, analysis of the temporal vibration signal to identify a plurality of changes in the temporal vibration signal comprises computing a temporal signal envelope from the temporal vibration signal and wherein identifying the plurality of changes in the temporal vibration signal comprises identifying a plurality of changes in the temporal signal envelope that are assigned to the plurality of features of the closing operation.

In an example, the processing unit is configured to implement a peak transform, an RMS transform, or a Hilbert transform to compute the temporal signal envelope from the temporal vibration signal.

In an example, analysing the temporal vibration signal to identify a plurality of changes in the temporal vibration signal that are assigned to the plurality of features of the opening operation comprises utilizing one of: descriptive statistics; Transforms; machine learning or artificial intelligence; characteristic times associated with the closing operation of the circuit breaker.

In an example, descriptive statistics is one of: mean, RMS, or Kurtosis analysis; and wherein Transforms is one of: FFT, Wavelets, empirical mode decomposition, Hilbert-Huang-Transform.

In an example, the method comprises determining by the processing unit a plurality of physical switch events and corresponding plurality of time points of the plurality of physical switch events over the opening operation of the circuit breaker comprising analysing the temporal vibration signal to identify a plurality of changes in the temporal vibration signal that are assigned to the plurality of physical switch events, and wherein determining the one or more characteristic times associated with the opening operation of the circuit breaker comprises utilizing the plurality of physical switch events and corresponding plurality of time points.

In an example, the method comprises implementing by the processing unit a change point detection algorithm, a piecewise linear approximation algorithm, a cluster based method, or a state space representation to identify the plurality of change points in the temporal signal envelope that are assigned to the plurality of physical switch events.

In an example, the cluster based method is a Gaussian Mixture Model "GMM", or a Hidden Markov Model "HMM"; and wherein the state space representation is a Kalman Filter or Likelihood Ratio Method.

In an example, the likelihood ratio method is RuLSIF or CUSUM.

In an example, the physical switch events comprises two or more of: instant of latch release; instant of onset of movement of the moveable contact away from the fixed contact; instant of separation of the moveable contact from the fixed contact; instant of stop of movement of the moveable contact.

In an example, computing the temporal signal envelope from the temporal vibration signal comprises a low pass filtering and/or a high pass filtering before and/or after computation of the temporal signal envelope.

In an example, determining the indication of operational functionality of the circuit breaker comprises comparing the plurality of features of the opening operation with corresponding baseline features for one or more calibration circuit breakers.

One or more of the monitoring systems can be retrofitted to a low voltage, medium voltage or high voltage circuit breaker or such a circuit breaker can be manufactured with such monitoring systems.

Thus a new technique has been developed enabling fault/failure detection and identification from vibration signals to recognize early a damage in circuit breakers (CBs). This involves the extraction of signal envelopes from the vibration data as fingerprints to classify the health status during closing & opening operations. Then, the comparison of the current closing/opening operation with the predefined healthy states allows to detect anomalies or changes in the signal envelopes over the CB lifetime that may indicate an early damage in the CB. For the anomaly detection, different methods from statistics and AI/ML can be used to extract characteristic features from the envelope signal. In a condition monitoring & diagnosis solution, the evaluation of the entire features of the signal envelopes can support to identify type and location of the fault/failure detected and indicate the need for maintenance of the CB drive.

Thus vibration monitoring is used to extract timing features from the detection vibration data, rather than requiring the use of more costly sensors, in order to provide for fault/failure detection and give additional information about the current health status of the CB.

Analysis of raw chaotic vibration signals can make the analysis more challenging and therefore deliver less satisfactory results in accuracy, robustness and reliability, has been addressed in certain embodiments through utilization of vibration domain knowledge (e.g. filtering techniques) that is used to extract vibration signal envelopes that are explicitly designed to make the chaotic nature of the signal easier to handle.

The low-cost accelerometer can usually be applied on a fixed part of the housing that is easy to retrofit, or can be mounted to a moving part. However, all types of sensors can be used for monitoring that deliver a vibration signal such as acoustic sensors or similar.

Specific and detailed embodiments of the monitoring systems and methods for a low voltage, medium voltage or high voltage circuit breaker are now described, where again reference is made to FIGS. 1-9.

Figure 1:
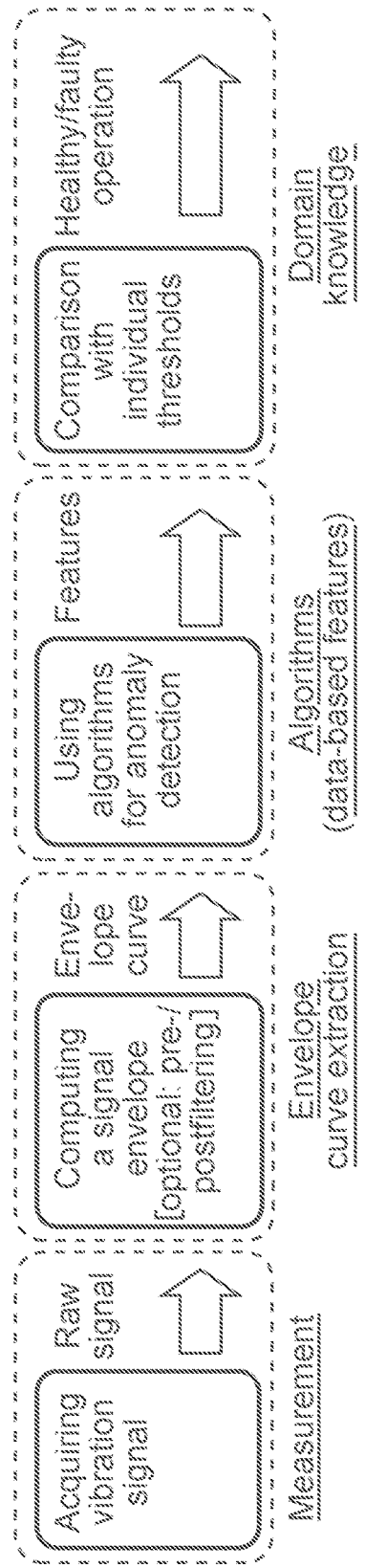
FIG. 1 shows an overview (schematic diagram) for fault/failure detection & identification in circuit breakers based on vibration signals in accordance with the disclosure.

FIG. 1 outlines the method for fault/failure detection & identification to recognize early damage in circuit breakers.

In FIG. 1 the measurement stage utilizes an accelerometer, acoustic microphone or further or other vibration sensors. Envelope curve extraction can make use of peak method, RMS, Hilbert transform, and optionally Low-/high pass filtering before and/or after envelope computation. The algorithms (data-based features) can be descriptive statistics (mean, RMS, Kurtosis, etc.), Transforms: FFT, Wavelets, EMD (empirical mode decomposition), HHT (Hilbert-Huang-Transform), etc., AI/ML: Autoencoders, PCA (Principal component analysis). The domain knowledge can include failure location (opening/closing coil, latch, operating mechanism, linkage, etc.), failure identification (failure mode: spring/damper, wear, friction/lubrication, etc.), health status for example: Green (healthy/safe zone), yellow (faulty/warning zone), red (failure/stop operation zone). Referring to FIG. 8, the Green zone is the bottom section, the yellow zone the middle section, and the red zone the top section.

In detail the new technique involves: [1] Acquiring a vibration signal measured by accelerometer, acoustic sensor or similar; [2] Computing a signal envelope by using one of the typical methods (e.g. peak, RMS, Hilbert transform, etc.). Optionally, the vibration and/or envelope signal can be filtered in a pre- and/or postprocessing step (e.g. high-pass filter, low-pass filter, bandpass filter, etc.); [3] Using methods for fault/failure detection & identification to recognize early damage by comparing at least one value/feature of at least one vibration signal to a comparison value/feature that can be also a set of healthy data. Different methods exist to derive typical values/features from the envelope of the vibration signal: Features from descriptive statistics such as RMS, Kurtosis, etc. Alternatively, the signal envelope can be transformed into the frequency domain by FFTs, Wavelets, EMD etc. AI/ML algorithms (e.g. autoencoders, PCA, cf. FIG. 9) can be additionally used to extract features from the envelopes. Switching times extracted from envelopes can also be used as further features. Features are calculated for the total operation and specific regions of breaker operation to identify the failure location (see FIGS. 6 & 7); [4] The healthy state of the circuit breaker can be defined individually by end-of-line measurements. Alternatively, the healthy state is known before from measurement data gained for CBs of the same type. Breaker domain knowledge & big data is used to define the thresholds for individual features evaluated for the total operation and the specific regions. A fault/failure is detected if at least one feature trespasses the defined thresholds. The change/trend of all calculated features is used to identify the location and failure mode.

Figure 2:
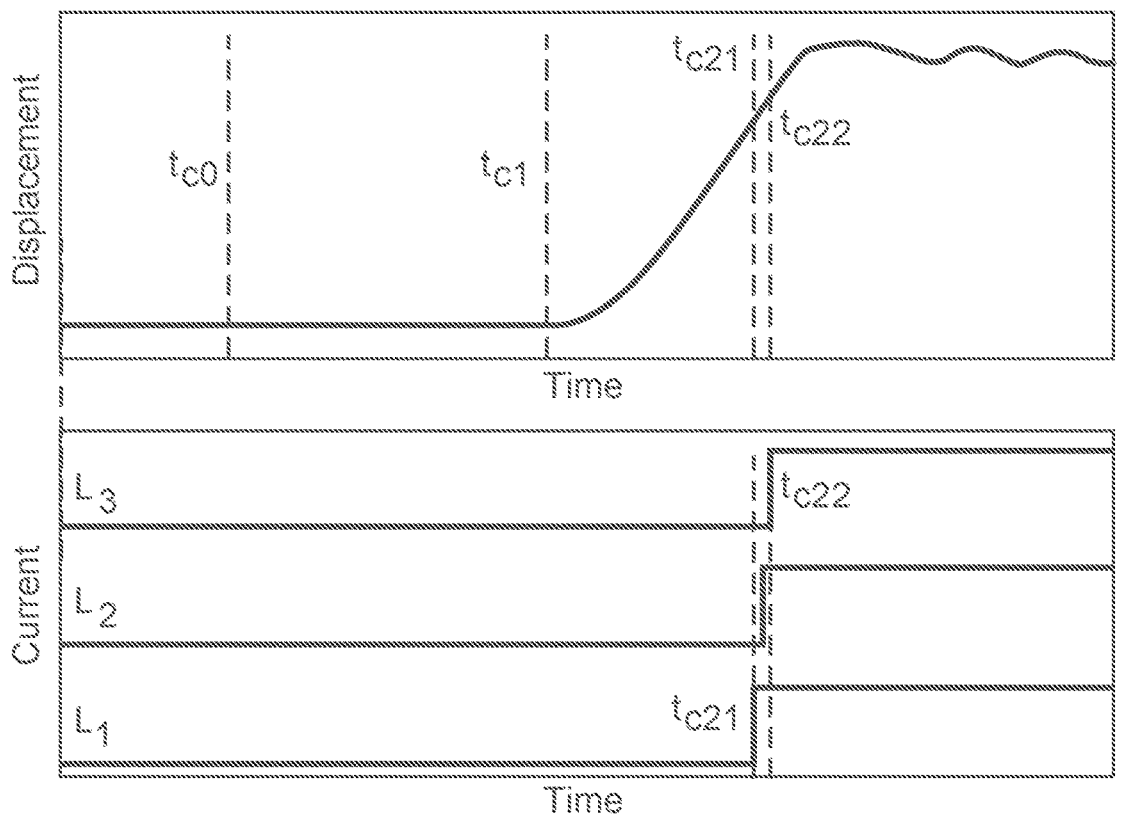
FIG. 2 shows a travel curve (exemplary only for one pole) & current curve in all three poles $L_1$, $L_2$ and $L_3$ for a typical closing operation of a medium-voltage circuit breaker: The time instant $t_{c0}$ is known, $t_{c1}$ is only a rough approximation (starting point of motion) and $t_{c21}$ & $t_{c22}$ are determined from current curve.

With respect to a closing operation of the CB, FIG. 2 shows a travel curve (exemplary only for one pole) & current curve in all three poles $L_1$, $L_2$ and $L_3$ for a typical closing operation of a medium-voltage circuit breaker.

Here the following times are shown:
$t_{c0}$: Initiation of closing operation—Current starts flowing through the closing coil
$t_{c1}$: Instant when moving contact starts traveling towards fixed contact
$t_{c21}$: Instant of contact touch (start of current flow) in first pole
  Pole 1 first closes, therefore $t_{c21}$ is defined by $L_1$.
$t_{c22}$: Instant when contacts remain closed (full current flow) in all three poles $L_1$, $L_2$ and $L_3$
  Pole 3 closes at last, therefore $t_{c22}$ is defined by $L_3$.
The time instant $t_{c0}$ is known, $t_{c1}$ is only a rough approximation (starting point of motion) and $t_{c21}$ & $t_{c22}$ are determined from current curve.

Figure 4:
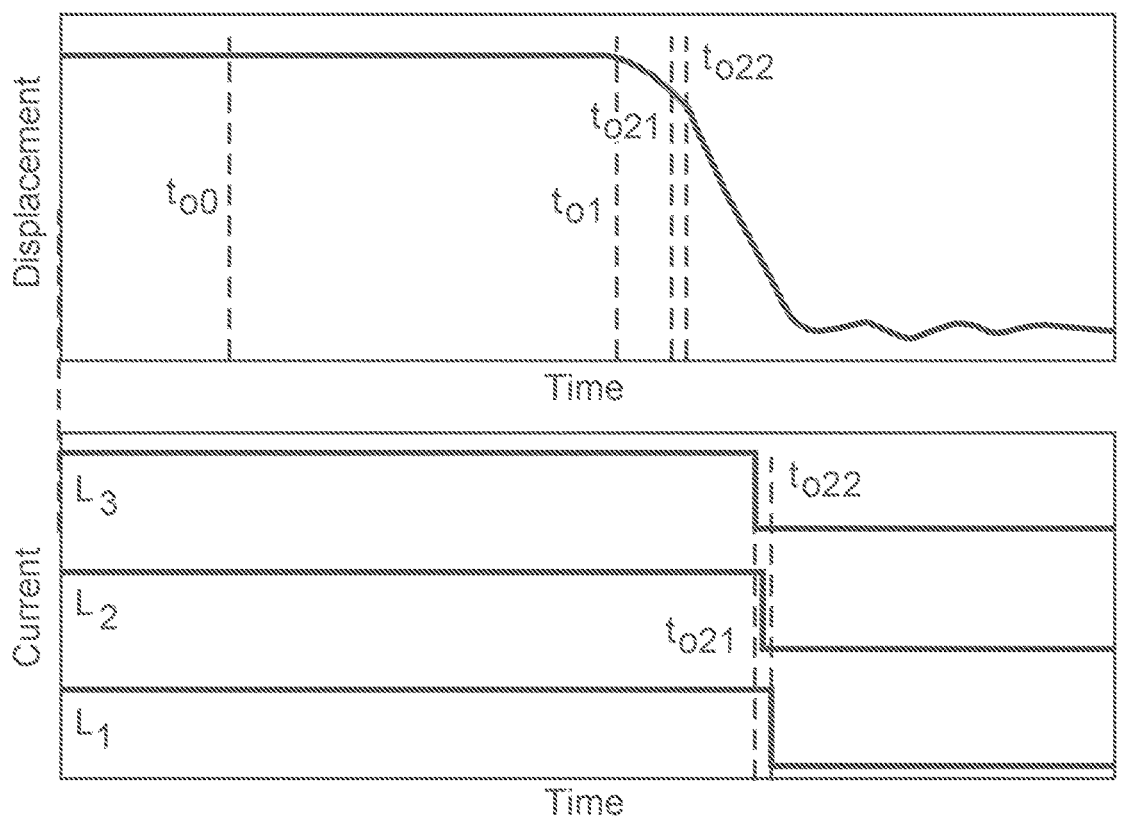
FIG. 4 shows a travel curve (exemplary only for one pole) & current curve in all three poles $L_1$, $L_2$ and $L_3$ for a typical opening operation of a medium-voltage circuit breaker: The time instant $t_{o0}$ is known, $t_{o1}$ is only a rough approximation (starting point of motion) and $t_{o21}$ & $t_{o22}$ are determined from current curve.

With respect to an opening operation of the CB, FIG. 4 shows a travel curve (exemplary only for one pole) & current curve in all three poles $L_1$, $L_2$ and $L_3$ for a typical opening operation of a medium-voltage circuit breaker.

Here the following times are shown:
$t_{o0}$: Initiation of opening operation Current starts flowing through the trip coil
$t_{o1}$: Instant when moving contact starts traveling backward for opening the contacts
$t_{o21}$: Instant of separation of contacts in the first pole
  Pole 3 first closes, therefore $t_{o21}$ is defined by $L_3$.
$t_{o22}$: Instant of separation of contacts in all poles
  Pole 1 opens at last, therefore $t_{o22}$ is defined by $L_1$.
The time instant $t_{o0}$ is known, $t_{o1}$ is only a rough approximation (starting point of motion) and $t_{o21}$ & $t_{o22}$ are determined from current curve; and FIGS. 3 and 5 then show the equivalent information derived from vibrational data.

Figure 3:
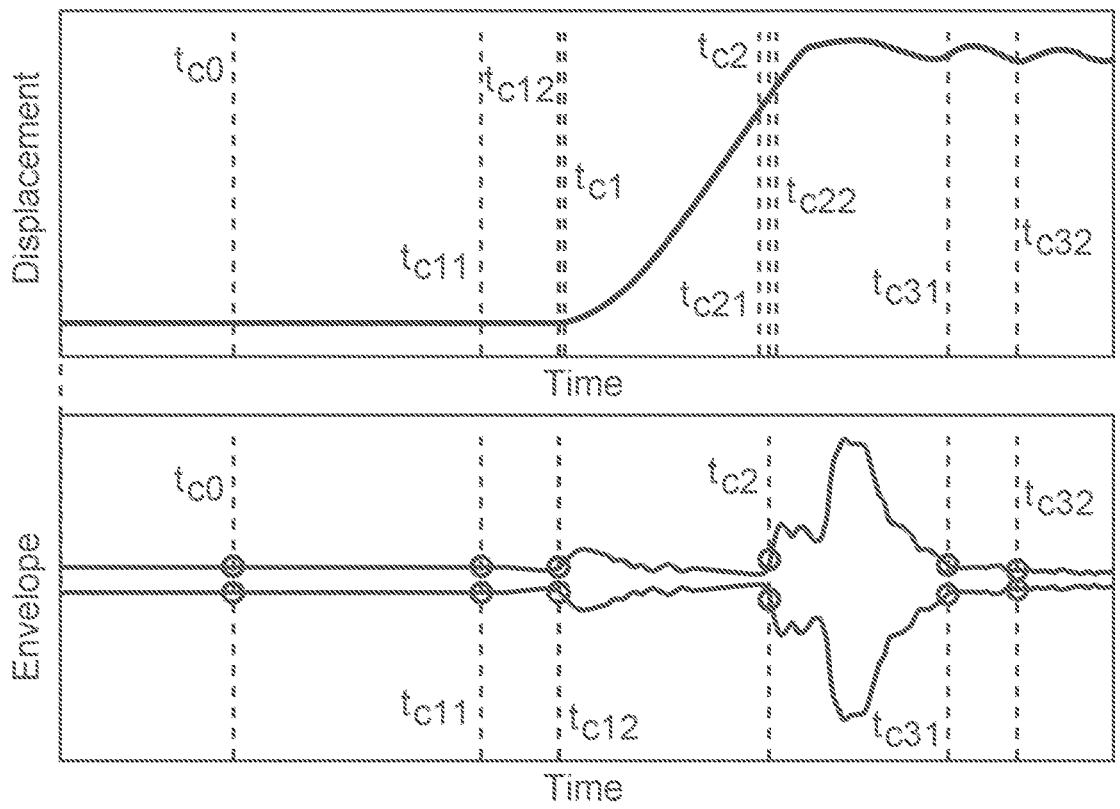
FIG. 3 shows a travel curve (exemplary only for one pole) & envelope curve of a vibration signal measured at a fixed part for a typical closing operation of a medium-voltage circuit breaker: Relevant time instants in the bottom plot can be extracted as changepoints from the envelope curve. These time instants are also shown in the top plot along with time instants as shown in FIG. 2.
Figure 5:
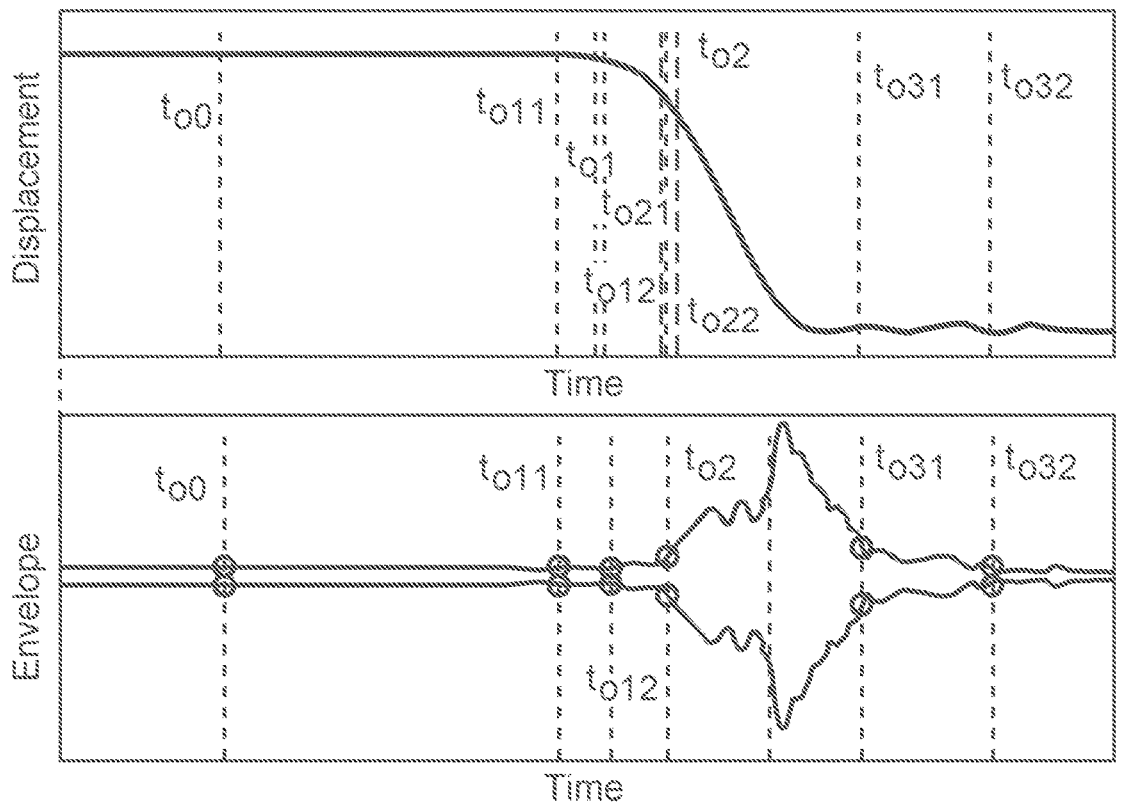
FIG. 5 shows a travel curve (exemplary only for one pole) & envelope curve of a vibration signal measured at a fixed part for a typical opening operation of a medium-voltage circuit breaker: Relevant time instants in the bottom plot can be extracted as changepoints from the envelope curve. These time instants are also shown in the top plot along with time instants as shown in FIG. 4.

In FIG. 3 the following times are shown:
$t_{c0}$: Initiation of closing operation
$t_{c11}$: Instant of latch release
$t_{c12}$: Instant when moving contact starts traveling towards fixed contact
$t_{c2}$: Instant of contact touch representing all three poles—
  $t_{c2}$ is between $t_{c21}$ and $t_{c22}$.
$t_{c31}$, $t_{c32}$: Instants when moving contacts stop traveling representing fixed closed position In FIG. 5 the following times are shown:
$t_{o0}$: Initiation of opening operation—Current starts flowing through the trip coil
$t_{o11}$: Instant of latch release
$t_{o12}$: instant when moving contact starts backward towards fixed contact
$t_{o2}$: Instant of separation of contacts representing all three poles $t_{o31}$, $t_{o32}$: Instants when moving contacts stop traveling representing fixed opened position Thus, as shown in FIGS. 3 and 5 the new technique enables the relevant time instants for closing operation (tc0, tc11, tc12, tc2, tc31, tc32) and relevant time instants for opening operation (to0, to11, to12, to2, to31, to32) to be detected and determined from the envelopes of the vibration signals.

From the detected time instants different closing and opening times can be calculated:
 a) Closing (opening) time: tc2–tc0 (to2–to0)
 b) Operation time of latch mechanism (until moving contact begins to travel): tc12–tc11 (to12–to11)
 c) Operation time of main mechanism (after moving contact starts to travel): tc2–tc12 (to2–to12)
 d) Latch release time from energizing the coils until latch is started to release: tc12–tc0 (to12–to0)
 e) Total operation time: tc32–tc0 (to32–to0)
 Note that tc32, to32 define the final fixed position after the operation when all oscillations are nearly damped out. However, tc31, to31 can be interpreted as an alternative fixed position after which overtravel and backtravel oscillations of smaller amplitude remain.

FIG. 6 also shows a vibrational signal for a closing operation of the CB.

In FIG. 6 the following times are shown:
 $t_{c0}$: Initiation of closing operation
 $t_{c11}$: Instant of latch release
 $t_{c12}$: Instant when moving contact starts traveling towards fixed contact
 $t_{c2}$: Instant of contact touch representing all three poles
 $t_{c31}$, $t_{c32}$: Instants when moving contacts stop traveling representing fixed closed position Also, shown in FIG. 6 are the different regions relating to the status of the CB.

These are:
 1. Energizing coil→Starting Latch release.
 2. Starting latch release→Starting movement of moving contact.
 3. Starting movement of moving contact→Contact touch.
 4. Contact touch→End of large movement of moving contact.
 5. End of large movement of moving contact→End of small movement of moving contact.

FIG. 7 also shows a vibrational signal for an opening operation of the CB.

In FIG. 7 the following times are shown:
 $t_{o0}$: Initiation of opening operation—Current starts flowing through the trip coil
 $t_{o11}$: Instant of latch release
 $t_{o12}$: Instant when moving contact starts backward towards fixed contact
 $t_{o2}$: instant of separation of contacts representing all three poles
 $L_{o31}$, $t_{o32}$: Instants when moving contacts stop traveling representing fixed opened position Also, shown in FIG. 7 are the different regions relating to the status of the CB.

These are:
 1. Energizing coil→Starting Latch release.
 2. Starting latch release→Starting movement of moving contact.
 3. Starting movement of moving contact→Contact separation.
 4. Contact separation End of large movement of moving contact.
 5. End of large movement of moving contact End of small movement of moving contact.

FIG. 8 exemplifies how thresholds can be used to determine if the CB is operating correctly where data is in the lower region or zone (termed Green), of the CB operation is possibly suspect where data is in the middle zone and should be monitored more closely or stopped for service (termed Yellow), or the CB operation is faulty where data is in the top zone and the CB should be stopped immediately (termed red). Also, this shows that the fault can be identified to be associated with specific operating sections of the overall closing/opening operations.

FIG. 4 therefore shows three typical switching times/features for the closing operation capturing different regions. Thus, for instance, two thresholds can be defined to derive the status of each feature: green (healthy/safe zone), yellow (faulty/warning zone), red (failure/stop operation zone). In the warning zone, recommendation can be given to the user for resolving the fault event or contacting the service for maintenance. In the red zone, the recommendation is to stop immediately the CB operation. Here, the fault/failure is located in the operating mechanism since only features of region 3 are affected. By considering all further features from descriptive statistics & AI/ML, the failure mode can be identified as insufficient lubrication.

FIG. 9 shows a representative view of how Principal Component analysis can be used to provide clear delineation of data, that can be used in the fault determination.

Thus in summary the new technique involves signal processing of the raw vibration signal to extract the envelope curves for each operation. An additional filter for the raw signal and/or envelope can be applied as well to further smooth the signal. All methods described below can also be applied to the raw vibration signal. Three types of features are calculated from the envelope curves: Descriptive statistical features, features from AI/ML algorithms and switching times features, Thus, the offsets of the features can be individually determined by end-of-line measurements or prior knowledge. For the healthy state, the variance of the features is known from field data and experience. The measured offset and the known variance can be used to define thresholds for all features. Especially, the segmentation into regions from FIGS. 6 & 7 for feature extraction supports to identify the fault/failure location. Characteristic changes/trends in the features can be assigned to several failure modes, e.g. spring & damper failures, increased friction, wear etc. Finally, the status of all features can be weighted to calculate an overall health status of the circuit breaker. This method can be also applied for CBs with electromagnetic drives.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In an example, analysis of the temporal vibration signal to identify a plurality of changes in the temporal vibration signal comprises computation of a temporal signal envelope from the temporal vibration signal. The identification of the plurality of changes in the temporal vibration signal can then comprise identification of a plurality of changes in the temporal signal envelope that are assigned to the plurality of features of the closing operation.

In an example, the processing unit is configured to implement a peak transform, an RMS transform, or a Hilbert transform to compute the temporal signal envelope from the temporal vibration signal.

In an example, analysis of the temporal vibration signal to identify a plurality of changes in the temporal vibration signal that are assigned to the plurality of features of the closing operation comprises utilization of one of: descriptive statistics; Transforms; machine learning or artificial intelligence; characteristic times associated with the closing operation of the circuit breaker.

In an example, descriptive statistics is one of: mean, RMS, or Kurtosis analysis; and wherein Transforms is one of: FFT, Wavelets, empirical mode decomposition, Hilbert-Huang-Transform.

In an example, the processing unit is configured to determine a plurality of physical switch events and corresponding plurality of time points of the plurality of physical switch events over the closing operation of the circuit breaker comprising analysis of the temporal vibration signal to identify a plurality of changes in the temporal vibration signal that are assigned to the plurality of physical switch events. The processing unit is configured to determine the one or more characteristic times associated with the closing operation of the circuit breaker comprising utilization of the plurality of physical switch events and corresponding plurality of time points.

In an example, the processing unit is configured to implement a change point detection algorithm, a piecewise linear approximation algorithm, a cluster based method, or a state space representation to identify the plurality of change points in the temporal signal envelope that are assigned to the plurality of physical switch events.

In an example, the cluster based method is a Gaussian Mixture Model "GMM", or a Hidden Markov Model "HMM"; and wherein the state space representation is a Kalman Filter or Likelihood Ratio Method.

In an example, the physical switch events comprises two or more of: instant of latch release; instant of onset of movement of the moveable contact towards the fixed contact; instant of contact touch of the moveable contact with the fixed contact; instant of stop of movement of the moveable contact.

In an example, computation of the temporal signal envelope from the temporal vibration signal comprises a low pass filtering and/or a high pass filtering before and/or after computation of the temporal signal envelope.

In an example, determination of the indication of operational functionality of the circuit breaker comprises a comparison of the plurality of features of the closing operation with corresponding baseline features for one or more calibration circuit breakers.

In a second aspect, there is provided a circuit breaker monitoring system, comprising: a vibration sensor; a processing unit; and an output unit.

The vibration sensor is configured to be mounted to a circuit breaker. The vibration sensor is configured to acquire a temporal vibration signal over at least a temporal portion of an opening operation of the circuit breaker. The opening operation comprises: initiation of the opening operation, latch release, movement of a moveable contact away from a fixed contact, separation of the moveable contact from the fixed contact, stop of movement of the moveable contact. The vibration sensor is configured to provide the temporal vibration signal to the processing unit. The processing unit is configured to determine a plurality of features of the opening operation, where each feature is associated with one of: the initiation of the opening operation, the latch release, the movement of the moveable contact away from the fixed contact, the separation of the moveable contact from the fixed contact, the stop of movement of the moveable contact. The determination of the plurality of features of the opening operation comprises analysis of the temporal vibration signal to identify a plurality of changes in the temporal vibration signal that are assigned to the plurality of features of the opening operation. The processing unit is configured to determine an indication of operational functionality of the circuit breaker comprising utilization of the plurality of features of the opening operation. The output unit is configured to output information relating to the indication of operational functionality of the circuit breaker.

In a third aspect, there is provided a circuit breaker monitoring method, comprising: mounting a vibration sensor to a circuit breaker; acquiring by the vibration sensor a temporal vibration signal over at least a temporal portion of a closing operation of the circuit breaker, wherein the closing operation comprises: initiation of the closing operation, latch release, movement of a moveable contact towards a fixed contact, contact touch of the moveable contact with the fixed contact, and stop of movement of the moveable contact; providing the temporal vibration signal to a processing unit; determining by the processing unit a plurality of features of the closing operation, wherein each feature is associated with one of: the initiation of the closing operation, the latch release, the movement of the moveable contact towards the fixed contact, the contact touch of the moveable contact with the fixed contact, and the stop of movement of the moveable contact, wherein the determining comprises analysis of the temporal vibration signal to identify a plurality of changes in the temporal vibration signal that are assigned to the plurality of features of the closing operation; determining by the processing unit an indication of operational functionality of the circuit breaker, wherein the determining comprises utilization of the plurality of features of the closing operation; and outputting by an output unit information relating to the indication of operational functionality of the circuit breaker.

In a fourth aspect, there is provided a circuit breaker monitoring method, comprising: mounting a vibration sensor to a circuit breaker; acquiring by the vibration sensor a temporal vibration signal over at least a temporal portion of an opening operation of the circuit breaker, wherein the opening operation comprises: initiation of the opening operation, latch release, movement of a moveable contact away from a fixed contact, separation of the moveable contact from the fixed contact, stop of movement of the moveable contact; providing the temporal vibration signal to a processing unit; determining by the processing unit a plurality of features of the opening operation, wherein each feature is associated with one of: the initiation of the opening operation, the latch release, the movement of the moveable contact away from the fixed contact, the separation of the moveable contact from the fixed contact, the stop of movement of the moveable contact, wherein the determination comprises analysis of the temporal vibration signal to identify a plurality of changes in the temporal vibration signal that are assigned to the plurality of features of the opening operation; determining by the processing unit an indication of operational functionality of the circuit breaker, wherein the determination comprises utilizing the plurality of features of the opening operation; and outputting by an output unit information relating to the indication of operational functionality of the circuit breaker.

In a fifth aspect, there is provided a low voltage, medium voltage or high voltage circuit breaker comprising a monitoring system according to the first aspect and/or comprising a monitoring system according to the second aspect.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed, No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A circuit breaker monitoring system, comprising:
   a vibration sensor;
   a processing unit; and
   an output unit;
   wherein the vibration sensor is configured to be mounted to a circuit breaker;
   wherein the vibration sensor is configured to acquire a temporal vibration signal over at least a temporal portion of a closing operation of the circuit breaker, wherein the closing operation comprises: initiation of the closing operation, latch release, movement of a moveable contact towards a fixed contact, contact touch of the moveable contact with the fixed contact, and stop of movement of the moveable contact;
   wherein the vibration sensor is configured to provide the temporal vibration signal to the processing unit;
   wherein the processing unit is configured to determine a plurality of features of the closing operation, wherein each feature is associated with one of: the initiation of the closing operation, the latch release, the movement of the moveable contact towards the fixed contact, the contact touch of the moveable contact with the fixed contact, and the stop of movement of the moveable contact, wherein the determination comprises analysis of the temporal vibration signal to identify a plurality of changes in the temporal vibration signal that are assigned to the plurality of features of the closing operation;
   wherein the processing unit is configured to determine an indication of operational functionality of the circuit breaker, wherein the determination comprises utilization of the plurality of features of the closing operation; and
   wherein the output unit is configured to output information relating to the indication of operational functionality of the circuit breaker.

2. Circuit breaker monitoring system according to claim 1, wherein analysis of the temporal vibration signal to identify a plurality of changes in the temporal vibration signal comprises computation of a temporal signal envelope from the temporal vibration signal and wherein identification of the plurality of changes in the temporal vibration signal comprises identification of a plurality of changes in the temporal signal envelope that are assigned to the plurality of features of the closing operation.

3. The circuit breaker monitoring system according to claim 2, wherein the processing unit is configured to implement a peak transform, an RMS transform, or a Hilbert transform to compute the temporal signal envelope from the temporal vibration signal.

4. The circuit breaker monitoring system according to claim 1, wherein analysis of the temporal vibration signal to identify a plurality of changes in the temporal vibration signal that are assigned to the plurality of features of the closing operation comprises utilization of one of: descriptive statistics; Transforms; machine learning or artificial intelligence; characteristic times associated with the closing operation of the circuit breaker.

5. The circuit breaker monitoring system according to claim 4, wherein descriptive statistics is one of: mean, RMS, or Kurtosis analysis; and wherein Transforms is one of: FFT, Wavelets, empirical mode decomposition, Hilbert-Huang-Transform.

6. The circuit breaker monitoring system according to claim 4, wherein the processing unit is configured to determine a plurality of physical switch events and corresponding plurality of time points of the plurality of physical switch events over the closing operation of the circuit breaker, wherein the determination comprises analysis of the temporal vibration signal to identify a plurality of changes in the temporal vibration signal that are assigned to the plurality of physical switch events, and Wherein the processing unit is configured to determine the one or more characteristic times associated with the closing operation of the circuit breaker comprising utilization of the plurality of physical switch events and corresponding plurality of time points.

7. The circuit breaker monitoring system according to claim 6, wherein the processing unit is configured to implement a change point detection algorithm, a piecewise linear approximation algorithm, a cluster based method, or a state space representation to identify the plurality of change points in the temporal signal envelope that are assigned to the plurality of physical switch events.

8. The circuit breaker monitoring system according to claim 7, wherein the cluster based method is a Gaussian Mixture Model "GMM", or a Hidden Markov Model "HMM"; and wherein the state space representation is a Kalman Filter or Likelihood Ratio Method.

9. The circuit breaker monitoring system according to claim 6, wherein the physical switch events comprises two or more of: instant of latch release; instant of onset of movement of the moveable contact towards the fixed contact; instant of contact touch of the moveable contact with the fixed contact; instant of stop of movement of the moveable contact.

10. The circuit breaker monitoring system according to claim 2, wherein computation of the temporal signal envelope from the temporal vibration signal comprises a low pass filtering and/or a high pass filtering before and/or after computation of the temporal signal envelope.

11. The circuit breaker monitoring system according to claim 1, wherein determination of the indication of operational functionality of the circuit breaker comprises a comparison of the plurality of features of the closing operation with corresponding baseline features for one or more calibration circuit breakers.

12. Circuit breaker monitoring system, comprising:
a vibration sensor;
a processing unit; and
an output unit;
wherein the vibration sensor is configured to be mounted to a circuit breaker;
wherein the vibration sensor is configured to acquire a temporal vibration signal over at least a temporal portion of an opening operation of the circuit breaker, wherein the opening operation comprises: initiation of the opening operation, latch release, movement of a moveable contact away from a fixed contact, separation of the moveable contact from the fixed contact, stop of movement of the moveable contact;
wherein the vibration sensor is configured to provide the temporal vibration signal to the processing unit;
wherein the processing unit is configured to determine a plurality of features of the opening operation, wherein each feature is associated with one of: the initiation of the opening operation, the latch release, the movement of the moveable contact away from the fixed contact, the separation of the moveable contact from the fixed contact, the stop of movement of the moveable contact, wherein the determination comprises analysis of the temporal vibration signal to identify a plurality of changes in the temporal vibration signal that are assigned to the plurality of features of the opening operation;
wherein the processing unit is configured to determine an indication of operational functionality of the circuit breaker, wherein the determination comprises utilization of the plurality of features of the opening operation; and
wherein the output unit is configured to output information relating to the indication of operational functionality of the circuit breaker.

13. A circuit breaker monitoring method, comprising:
providing a vibration sensor mounted to a circuit breaker;
acquiring by the vibration sensor a temporal vibration signal over at least a temporal portion of a closing operation of the circuit breaker, wherein the closing operation comprises: initiation of the closing operation, latch release, movement of a moveable contact towards a fixed contact, contact touch of the moveable contact with the fixed contact, and stop of movement of the moveable contact;
providing the temporal vibration signal to a processing unit;
determining by the processing unit a plurality of features of the closing operation, wherein each feature is associated with one of: the initiation of the closing operation, the latch release, the movement of the moveable contact towards the fixed contact, the contact touch of the moveable contact with the fixed contact, and the stop of movement of the moveable contact, wherein the determining comprises analysis of the temporal vibration signal to identify a plurality of changes in the temporal vibration signal that are assigned to the plurality of features of the closing operation;
determining by the processing unit an indication of operational functionality of the circuit breaker; wherein the determining comprises utilization of the plurality of features of the closing operation; and
outputting by an output unit information relating to the indication of operational functionality of the circuit breaker.

14. A circuit breaker monitoring method, comprising:
providing a vibration sensor mounted to a circuit breaker;
acquiring by the vibration sensor a temporal vibration signal over at least a temporal portion of an opening operation of the circuit breaker, wherein the opening operation comprises: initiation of the opening operation, latch release, movement of a moveable contact away from a fixed contact, separation of the moveable contact from the fixed contact, stop of movement of the moveable contact;
providing the temporal vibration signal to a processing unit;
determining by the processing unit a plurality of features of the opening operation, wherein each feature is associated with one of the initiation of the opening operation, the latch release, the movement of the moveable contact away from the fixed contact, the separation of the moveable contact from the fixed contact, the stop of movement of the moveable contact, wherein the determination comprises analysis of the temporal vibration signal to identify a plurality of changes in the temporal vibration signal that are assigned to the plurality of features of the opening operation;
determining by the processing unit an indication of operational functionality of the circuit breaker, wherein the determination comprises utilizing the plurality of features of the opening operation; and
outputting by an output unit information relating to the indication of operational functionality of the circuit breaker.

* * * * *